(12) United States Patent
Swanson et al.

(10) Patent No.: US 7,525,803 B2
(45) Date of Patent: Apr. 28, 2009

(54) POWER CONVERTER HAVING MULTIPLE LAYER HEAT SINKS

(75) Inventors: Jason Walter Swanson, Phoenix, AZ (US); Bryan Wayne McCoy, Phoenix, AZ (US); Arthur Kenneth Dewyer, Scottsdale, AZ (US)

(73) Assignee: iGo, Inc., Scottsdale, AZ (US)

( * ) Notice: Subject to any disclaimer, the term of this patent is extended or adjusted under 35 U.S.C. 154(b) by 297 days.

(21) Appl. No.: 11/344,507

(22) Filed: Jan. 31, 2006

(65) Prior Publication Data

US 2007/0175655 A1    Aug. 2, 2007

(51) Int. Cl.
*H05K 7/20*    (2006.01)

(52) U.S. Cl. .................. 361/709; 174/524; 174/526; 174/548; 361/711; 361/712; 361/713; 361/702; 361/704

(58) Field of Classification Search .................. 174/250, 174/252, 260, 268, 794, 795, 51, 524, 526, 174/548, 262; 361/611, 748–751, 760–762, 361/755, 780, 790, 795, 799, 679, 701, 702, 361/704, 709, 711, 712, 713
See application file for complete search history.

(56) References Cited

U.S. PATENT DOCUMENTS

| | | | | |
|---|---|---|---|---|
| 6,129,598 | A * | 10/2000 | Yu et al. | 439/883 |
| 6,433,274 | B1 * | 8/2002 | Doss et al. | 174/50 |
| 6,651,322 | B1 * | 11/2003 | Currie | 29/840 |
| 6,741,125 | B2 * | 5/2004 | Arai et al. | 330/66 |
| 6,778,405 | B2 * | 8/2004 | Boylan et al. | 361/767 |
| 2002/0180037 | A1 * | 12/2002 | Shirakawa et al. | 257/727 |
| 2003/0133259 | A1 * | 7/2003 | Meyer et al. | 361/677 |
| 2004/0144561 | A1 * | 7/2004 | Osanai et al. | 174/252 |
| 2005/0040515 | A1 * | 2/2005 | Inoue et al. | 257/706 |
| 2006/0007721 | A1 * | 1/2006 | Rodriguez et al. | 363/146 |
| 2006/0228825 | A1 * | 10/2006 | Hembree | 438/51 |

* cited by examiner

*Primary Examiner*—Jeremy C Norris
*Assistant Examiner*—Hoa C Nguyen
(74) *Attorney, Agent, or Firm*—Robert C. Klinger

(57) ABSTRACT

A power converter including a printed circuit board (PCB) having a plurality of heat conductive layers configured to sink heat generated by the power converter electronics. Each of these heat conductive layers are comprised of thermally conductive material configured as planar sheets, each of these heat conductive layers being coupled to at least one wire to sink heat therefrom, such as via a wire of an input cable and/or output cable. Advantageously, a more compact power converter is realized having improved power output while operating within safety guidelines.

5 Claims, 2 Drawing Sheets

POWER CONVERTER HAVING MULTIPLE LAYER HEAT SINKS

FIELD OF THE INVENTION

The present invention is generally related to power converters, and more particularly to power converters adapted to power portable electronic devices.

BACKGROUND OF THE INVENTION

Power converters are typically used to power and/or recharge the batteries of portable electronic devices including notebook computers, PDA's, MP3 players, digital cameras, and wireless phones just to name a few. Some of the portable electronic devices are configured to require a significant amount of power, with some notebook computers now consuming up to 140 watts.

At the same time, portable electronic device users are demanding that these power converters be smaller and smaller. The miniaturization of these power supplies is constrained by the amount of heat generated during the power conversion, such as in a DC/DC converter, AC/DC converter, DC/AC converter, and an AC/AC converter. Improved efficiency of the power conversion is one way to reduce the heat generated by the power converter. More efficient heat transfer devices are also being designed to better sink generated heat and release it to the ambient. Heat fans and cooling fins are just some types of cooling designs to keep the power converter operating within safe limits, such as established by numerous safety agencies including UL Laboratories.

SUMMARY OF INVENTION

The present invention achieves technical advantages as a power converter including a printed circuit board (PCB) having a plurality of heat conductive layers configured to sink heat generated by the power converter electronics. Each of these layers are comprised of thermally conductive material configured as planar sheets, each of these thermal layers being coupled to at least one wire to sink heat therefrom, such as via a wire of an input cable and/or output cable. Advantageously, a more compact power converter is realized having improved power output while operating within safety guidelines.

DETAILED DESCRIPTION OF THE PRESENT INVENTION

Figure 1:
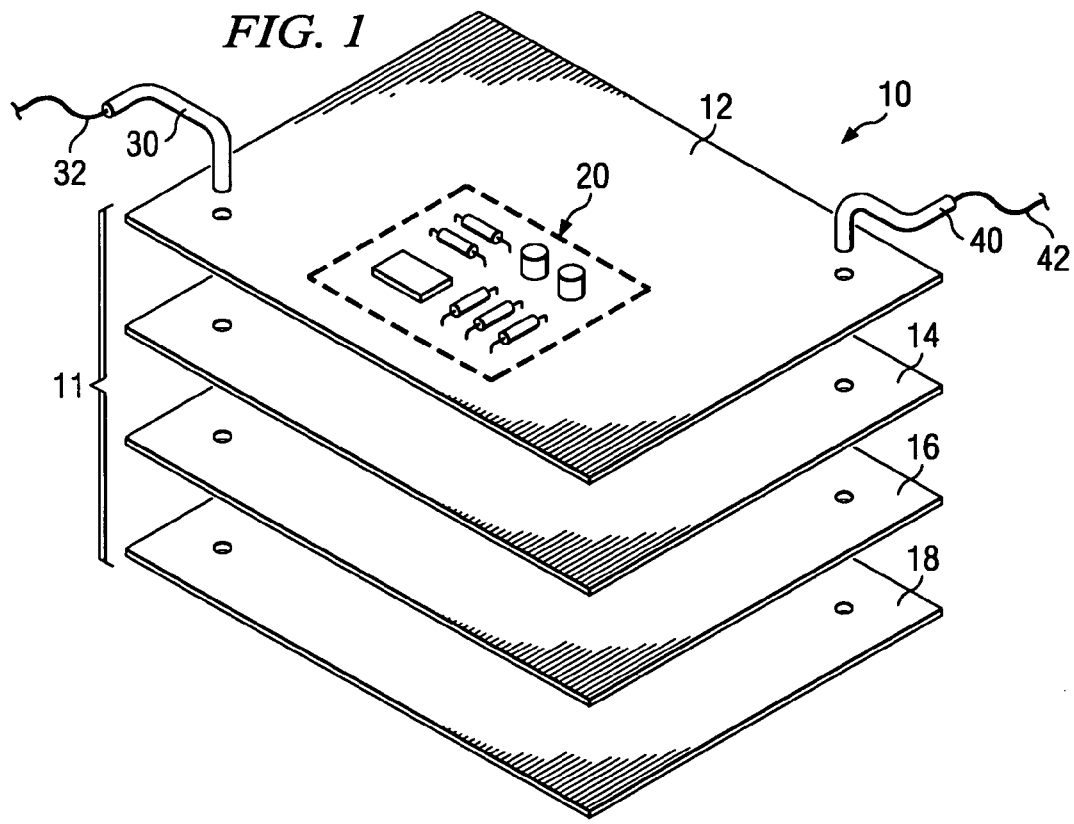
FIG. 1 is an exploded perspective view of a power converter including a printed circuit board having multiple thermal planes.

Referring now to FIG. 1 there is shown at 10 an exploded perspective view of a power converter having a multiple layer printed circuit board 11 including layers 12, 14, 16 and 18. Top layer 12 includes electrical traces and electrical components forming the power converter circuitry 20. Disposed thereunder is shown two thermally conductive layers 14 and 16 that are spatially separated from one another, and from the electronics layer 12, each adapted to sink heat from the first layer during operation of the circuitry 20. Lower layer 18 is also comprised of components forming another stage of the power converter, or adding to the power converter shown in 20 and serves to operate as a separate power stage altogether, or an adjoining power stage 20.

Figure 2:
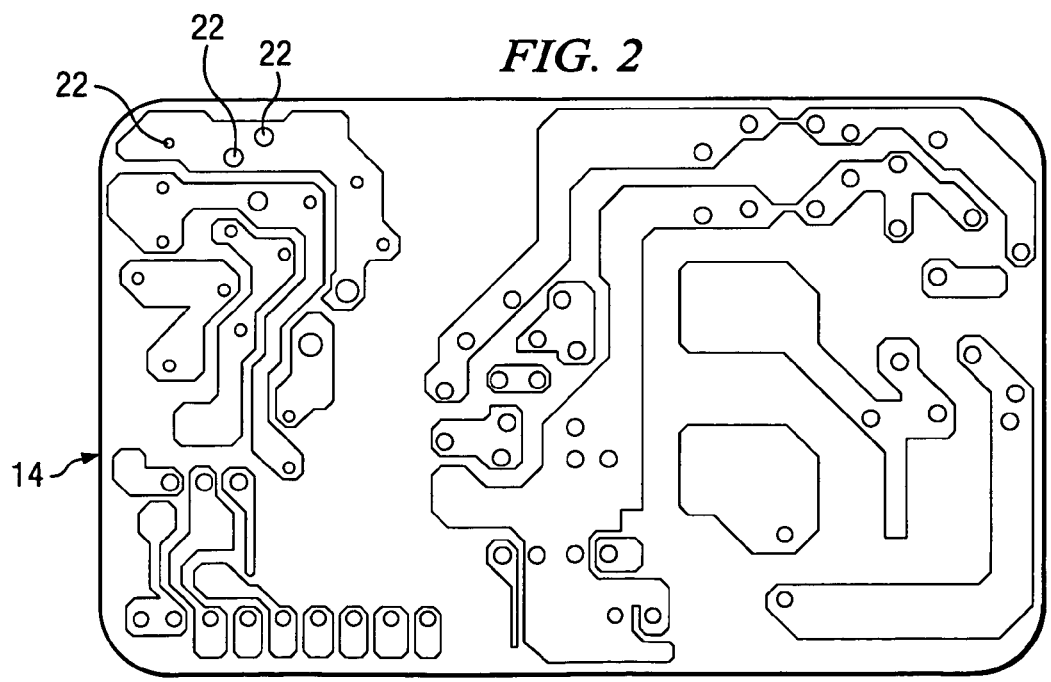
FIG. 2 is a top view of a circuit component layer.
Figure 3A:
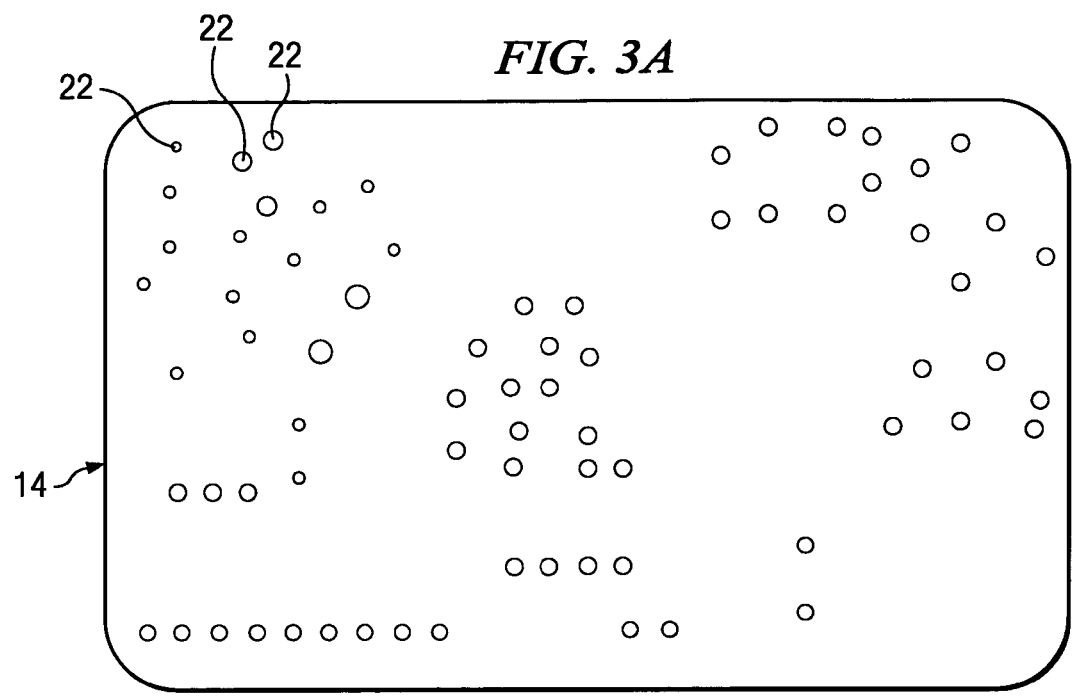
FIG. 3a and FIG. 3b are top views of thermal material layers forming a second and third layer of the printed circuit board shown in FIG. 1.
Figure 3B:
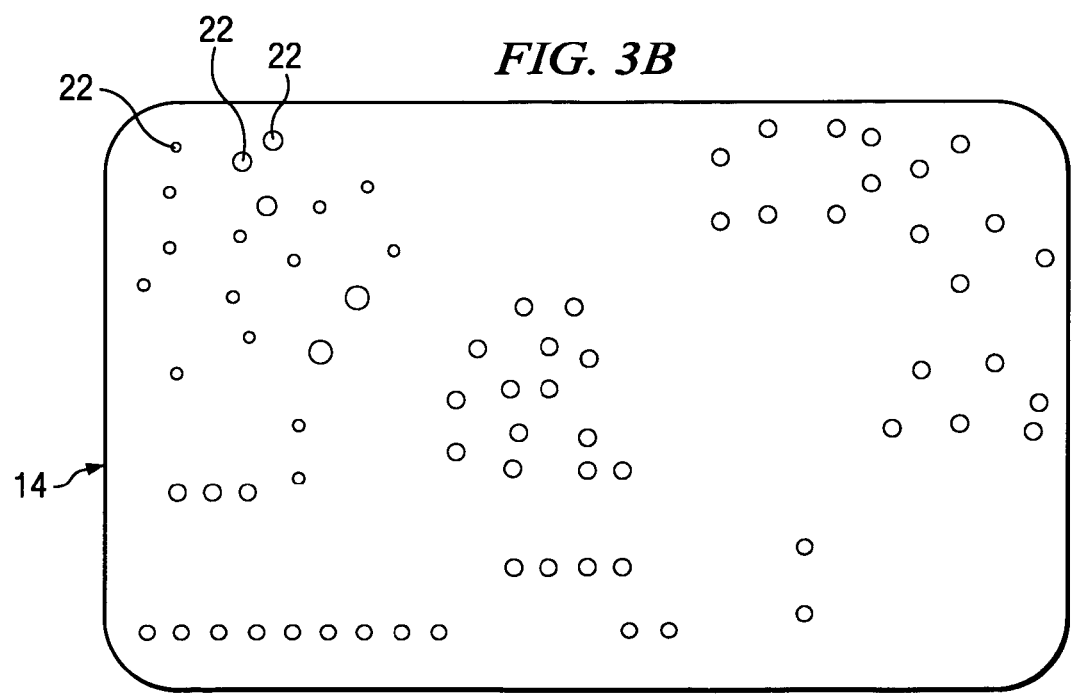

Referring now to FIG. 2, there is shown a top view of the first layer, 14, seen to include electrically conductive traces and pads for receiving suitable electronic components and interconnecting the same. Further shown are pluralities of vias shown at 22, the vias are electrically and thermally coupled to the underlying second and third layers and to the first layer 14 with the common vias being shown at 22. Preferably, these second and third heat sink layers are comprised of a thermally conductive material, such as a metal, and preferably, a highly thermally conductive material such as copper, although other materials are suitable and within the scope of this invention.

Advantageously, the pluralities of heat sink layers are provided in the common printed circuit board 11 as shown in FIG. 1. In addition, each of these second and third layers are physically separated from each other, but electrically and thermally coupled to each other to sink heat from the first layer, and to efficiently balance and distribute heat therebetween.

Referring back to FIG. 1, there is shown an input cable 30 and an output cable 40 each coupled to the circuitry 20 of first layer 12 to provide power thereto, and provide therefrom, respectively. At least two electrical conductors are provided in each cable 30 and 40 to provide the power thereto, which power may be an AC or DC power. In addition, at least one thermally conductive member 32 and 42, preferably a copper wire, is included in respective cable 30 and 40 to facilitate sinking heat from the second and third thermally conductive layers 14 and 16 away from power converter 10. Thus, heat may be sunk via input cable 30 to the power source, and heat may also be sunk via output cable 40 to the portable electronic device to be powered.

Advantageously, due to the multiple heat sink layers, the power converter 10 can be disposed in a housing, (not shown) that has a very thin profile and small overall area. A significant amount of power can be converted using power converter 10, with the generated heat being universally dispersed to the multiple heat sink layers 14 and 16 without generating a hot spot to the encompassing housing such that power converter 10 operates within safety guidelines, such as those established by UL Laboratories.

By way of example, power converter 10 may comprise a 90 watt power converter operating at 90% efficiency, whereby the dimensions of the printed circuit board may be 2.48 by 2.48 inches, disposed in a housing having a thickness of no greater than 0.55 inches and operating less than 85 degrees Celsius. The thermal distribution of the inner layer heat sinks and the heat sinking of the input and output cable allows the power supply to become more like the ideal thermal model in which all heat is uniformly distributed allowing the power supply to dissipate more heat to the environment, thus staying cooler.

This design further achieves technical advantages in that the thermal heat sinking properties can be consistently replicated during manufacturing, which provides improved quality control and fewer defective units during manufacturing.

Though the invention has been described with respect to a specific preferred embodiment, many variations and modifications will become apparent to those skilled in the art upon reading the present application. It is therefore the intention that the appended claims be interpreted as broadly as possible in view of the prior art to include all such variations and modifications.

What is claimed is:

1. A power converter, comprising;
   a multi-layered printed circuit board configured to power a portable electronic device, comprising:
   a first layer having a printed electrical circuit thereon including electrical components forming a power supply;
   a plurality of heat sink layers spaced from each other and the first layer, the heat sink layers each comprising a continuous planar area of thermally conductive material;
   a thermally conductive member thermally coupled to each of the heat sink layers and configured to draw heat from the power supply to the heat sink layers; and,
   wherein the heat sink layers are separated from each other by an electrically non-conductive material, do not comprise circuit traces, and are each thermally coupled to the electrical components of the first layer by a plurality of vias extending through the electrically non-conductive material.

2. The power converter as specified in claim 1 wherein the electrical components and printed electrical circuit comprise a power converter.

3. The power converter as specified in claim 2 wherein the thermally conductive member comprises a wire.

4. The power converter as specified in claim 3 wherein the electrical circuit has an input configured to receive power, further comprising an input cable coupled to the input and including the wire.

5. The power converter as specified in claim 4 wherein the electrical circuit has an output configured to provide output power, further comprising an output cable coupled to the output and further including a wire thermally coupled to each of the heat sink layers.

* * * * *